United States Patent
Rangarajan et al.

(10) Patent No.: US 6,444,038 B1
(45) Date of Patent: Sep. 3, 2002

(54) DUAL FRITTED BUBBLER

(75) Inventors: Sri Prakash Rangarajan, Malden; John O'Grady, Beverly, both of MA (US)

(73) Assignee: Morton International, Inc., Chicago, IL (US)

( * ) Notice: Subject to any disclaimer, the term of this patent is extended or adjusted under 35 U.S.C. 154(b) by 0 days.

(21) Appl. No.: 09/472,403

(22) Filed: Dec. 27, 1999

(51) Int. Cl.⁷ .............................................. C23C 16/00
(52) U.S. Cl. ..................... 118/715; 392/387; 392/388; 427/248.1; 34/586; 34/587; 34/576
(58) Field of Search .................... 118/726; 392/387, 392/388; 427/248.1; 34/576, 586, 587

(56) References Cited

U.S. PATENT DOCUMENTS

| | | | | |
|---|---|---|---|---|
| 4,140,735 A | * | 2/1979 | Schumacher | 261/22 |
| 4,947,790 A | * | 8/1990 | Gartner | 118/726 |
| 5,603,169 A | * | 2/1997 | Kim | 34/587 |
| 5,711,816 A | * | 1/1998 | Kirlin | 118/726 |

FOREIGN PATENT DOCUMENTS

| | | |
|---|---|---|
| EP | 0 714 999 A | 6/1996 |
| GB | 2 223 509 A | 4/1990 |
| GB | 2223509 | * 11/1990 |

* cited by examiner

*Primary Examiner*—Richard Bueker
(74) *Attorney, Agent, or Firm*—S. Matthew Cairns

(57) ABSTRACT

A dual chambered bubbler vessel for use with solid organometallic source material for chemical vapor phase deposition systems, and a method for transporting a carrier gas saturated with source material for delivery into such systems. The bubbler vessel is designed so that carrier gas enters through an inlet in the top thereof into an inlet chamber and after it has been saturated with the organometallic vapors exits through a first porous frit located in the floor of the inlet chamber into an outlet chamber and is withdrawn from the bubbler after passing through a second porous frit element located at the outlet of the bubbler.

11 Claims, 7 Drawing Sheets

DUAL FRITTED BUBBLER

BACKGROUND OF THE INVENTION

1. Field of the Invention

This is a continuation in part of copending application Ser. No. 09/378,274 filed Aug. 20, 1999. The present invention relates to a vapor generator comprising a high-integrity, high-purity dual chambered chemical vapor deposition (CVD) source vessel. The vapor generator is designed for the unique requirements of vapor phase epitaxy and other chemical vapor deposition equipment used in compound semiconductor and thin-film processes. The vapor generator is designed to safely handle and maintain the highest purity of extremely reactive chemicals.

Specifically, the present invention relates to a dual chambered vapor generator vessel and a method for obtaining steady, i.e. uniform, delivery of a solid organometallic source for chemical vapor deposition systems. A non-uniform delivery rate detrimentally affects the composition of the epitaxial layers grown using a MOVPE (Metal-Organic-Vapor-Phase Epitaxy) system. The present invention also is advantageous when used with MOMBE (Metal-Organic Molecular Beam Epitaxy) and CBE (Chemical Beam Epitaxy) vapor deposition systems.

2. Description of the Prior Art

Group III–V compound semiconductor materials comprising different monocrystalline layers with varying compositions and with thicknesses ranging from fractions of a micron to a few microns are used in the production of many electronic and more particularly optoelectronic devices such as lasers and photodetectors. Chemical vapor deposition methods using organometallic compounds are conventionally employed in the CVD art for the deposition of metal thin-films or semiconductor thin-films of Group III–V compounds. Compounds conventionally used in the semiconductor industry include cyclopentadienyl magnesium ($Cp_2Mg$), trimethyl aluminum (TMA), trimethyl gallium (TMG), triethyl gallium (TEG), trimethyl antimony (TMSb), dimethyl hydrazine (DMHy), trimethyl indium (TMI), etc. Solid precursors, such as TMI are used in the MOVPE of indium containing semiconductors. The solid TMI is placed in a cylindrical vessel or container commonly referred to as a bubbler and subjected to a constant temperature wherein the solid precursor is vaporized. A carrier gas, e.g. hydrogen, is employed to pick up the precursor vapor and transport it to a deposition system. Most solid precursors exhibit poor and erratic delivery rates when used in a conventional bubbler-type precursor vessel.

Conventional bubblers include both bubbler vessels having a dip-tube attached to the inlet exemplified by the disclosure in U.S. Pat. No. 4,506,815 or the gas-feeding device exemplified by the disclosure in U.S. Pat. No. 5,755,885 which has a plurality of gas-ejecting holes in the dip-tube to introduce the carrier gas into the container. These conventional bubbler systems can result in a non-stable, non-uniform flow rate of the precursor vapors especially with solid organometallic precursors. Such non-uniform flow rate produces an adverse affect on the compositions of the semiconductor films being grown in MOVPE reactors. Another bubbler system developed by Morton International, Inc. eliminated the use of a dip—tube. While such dip—tubeless bubbler was found to provide a uniform flow rate, it failed to provide a consistently high concentration of precursor material.

The inability to achieve a stable supply of feed vapor from solid precursors at a consistently high concentration is problematic to the users of such equipment, particularly in the manufacture of semiconductor components. The unsteady organometallic flow rate can be due to a variety of factors: such as progressive reduction in the total surface area of the chemical from which evaporation takes place, channeling through the solid precursor where the carrier gas has minimal contact with the precursor and the sublimation of the precursor solid to parts of the bubbler where efficient contact with the carrier gas is impossible.

Various methods have been adopted to overcome the flow problems such as 1) use of reverse flow bubblers, 2) use of dispersion materials in the precursor materials, 3) employing diffuser plates beneath the bed of solids, 4) employing conical cylinder designs and 5) beating on the cylinder to de-agglomerate the solid precursor. U. S. Pat. No. 4,704,988 discloses a bubbler design wherein the vessel is separated by a porous partition into first and second compartments. Vaporized reactive material contained in the first compartment diffuses through the partition into the second compartment where it contacts and is entrained in a carrier gas for transport from the vessel into the appropriate deposition chamber.

Therefore, as mentioned above the stable flow/pick-up of solid precursor vapor is an ongoing and major drawback associated with prior art bubbler vessels. Present bubbler vessel designs and different delivery configurations fail to provide an uniform flow rate with maximum pick-up of precursor material. Although the single frifted bubbler design of copending application Ser. No. 09/378,274 provides better stability and pickup of precursor vapor than prior art bubblers not employing a frit element and are capable of providing improved precursor pickup, there is still a need in the art for bubbler devices that are tailored to provide a uniform and high concentration of the precursor vapors until total depletion of the vapor source. Another bubbler designed to improve precursor pickup is disclosed in U.S. Pat. No. 5,603,169 and employs lower and upper porous plates through which the carrier gas passes. The lower porous plate is located above the carrier gas feed inlet and supports the solid precursor load. In operation, carrier gas passes through the lower porous plate before contacting the solid precursor. A compressing plate is located above the lower porous plate for pressing the precursor by its weight. This prior art device comprises a more complex structure than embodied in the simple construction of the present invention.

SUMMARY OF THE INVENTION

The vapor generator provided by the present invention, is designed to eliminate the poor and erratic delivery rates exhibited by existing prior art designs as well as their inability to provide complete uniform depletion of the precursor material. The novel device of the present invention is designed to operate as a vapor delivery vessel for solid reagent sources. The bubbler device of the present invention by employing dual porous frit elements achieves saturation of the carrier gas with the organometallic vapor without having to bubble the carrier gas through the solid precursor. Avoiding this action prevented the formation of channels in the solid thereby resulting in a uniform delivery of the material until it was depleted as shown in FIG. 7. The new dual frit bubbler design of the present invention (FIG. 3) overcomes the problems of prior art bubblers not employing porous frit elements by avoiding having to bubble through the solid precursor. The new device design according to the invention can in particular be used in a vapor phase epitaxy system comprising an epitaxy reactor for introducing into the latter at least one of the reagents in the gaseous state, ie. solid organometallic compounds that are used in the semiconductor industry, such as TMI, $Cp_2Mg$, $CBr_4$, etc.

An object of the present invention is to provide a vapor delivery device having a simple and economical construction design for delivering a stable/consistent flow at a higher concentration output than possible from existing bubbler designs.

Another object of the present invention is to provide a vapor delivery device design capable of achieving a constant delivery rate until total depletion of the solid organometallic precursor.

According to still another object of the present invention, there is provided a vapor generator design which is capable of achieving rapid responses to changes in temperature and carrier gas flow parameters.

According to a further object of the present invention, there is provided a vapor delivery design capable of achieving a constant flow rate/concentration delivery over a range of concentrations depending upon the operating parameters such as temperature, pressure, nature of the carrier gas and its flow rate.

DETAILED DESCRIPTION OF THE PREFERRED EMBODIMENTS

The gas-feeding device of the present invention comprises a dual chambered cylindrically shaped vessel for producing saturated vapors of solid organometallic precursor using a carrier gas. The material used for constructing the vessel is not limited and may be either glass, teflon or metal provided that it is inert to the organometallic compound being processed therein. Usually, metals are employed for safety reasons. Stainless steels are particularly preferred. For example, the entire assembly can be made from 316 L stainless steel. The carrier gas may comprise any inert gas which does not react with the organometallic compound. Examples of carrier gases which may be used in carrying out the invention include hydrogen, nitrogen, argon, and helium. The vessel is filled with the solid precursor organometallic compound through an appropriate fill port on the top of the vessel.

The vessel containing the solid precursor source may be placed in a thermostatic bath and maintained at a suitable temperature. The temperature range to which the vessel is heated will depend on the vaporization temperature of the particular precursor organometallic compound. Any system of heating the vessel to the appropriate temperature will suffice as long as it provides the heat required to vaporize the solid precursor material. For example, the vessel can be heated either by the use of a halocarbon oil flowing through a copper tube surrounding the bubbler or by direct immersion into a heated oil bath. The carrier gas enters the input chamber of the device through an inlet at the top of the vessel and after it has been saturated with the vapors of the organometallic compound the carrier gas stream exits the input chamber of the device through a first porous frit element located in the floor of the inlet chamber into an outlet chamber which is in fluid contact with the inlet chamber and then exits the vessel through a second porous frit element located at the outlet of the vessel. Preferably, the second porous frit element is attached to the inside surface of that portion of the outlet tube located inside the bubbler. A standard mass flow controller (not shown) controls the flow rate of the carrier gas. After exiting from the outlet, the carrier gas saturated with organometallic vapor is fed into the appropriate deposition chamber.

Figure 1:
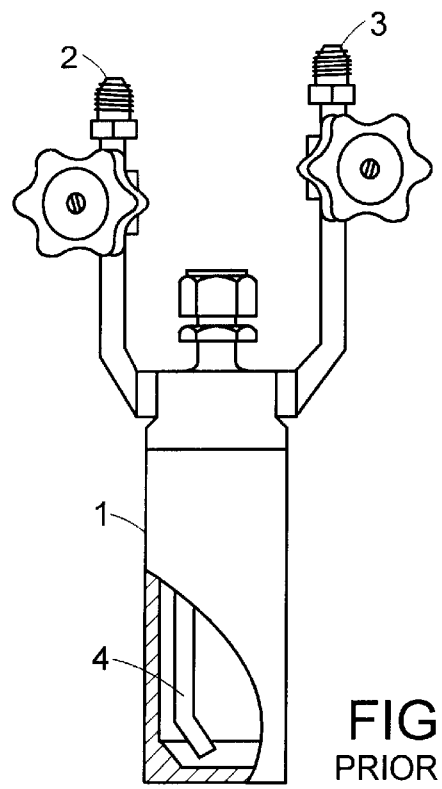
FIG. 1 is a cross sectional view illustrative of a conventional prior art dip tube bubbler.

FIG. 1 illustrates a prior art dip-tube bubbler design of the type disclosed in U.S. Pat. No. 4,506,815 comprising an elongated cylindrical container 1, an inlet tube 2 for delivering carrier gas, and an outlet tube 3 for exhausting the precursor vapor which terminates in a dip-tube 4 which extends into the precursor material contained in container 1.

Figure 2:
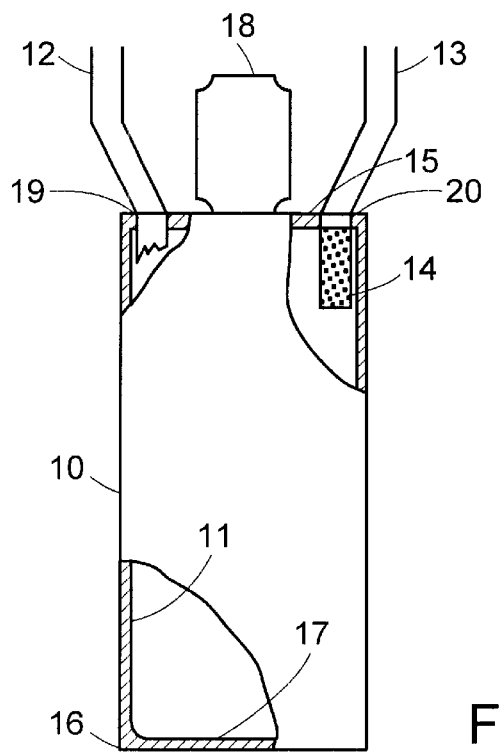
FIG. 2 is a cross sectional view illustrative of the fritted bubbler disclosed in copending application Ser. No. 09/378,274.

FIG. 2 shows an embodiment of the apparatus described in copending application Ser. No. 09/378,274 comprising an elongated cylindrical container 10 having an inner surface 11 defining a substantially constant cross section throughout the length of cylinder 10, a top closure portion and a bottom metallic closure portion 16 having a flat bottom portion 17. Top closure portion has fill port 18, inlet 19 and outlet 20 openings. Inlet tube 12 and outlet tube 13 communicate with inlet opening 19 and outlet opening 20 in closure portion 15 of the container. The lower end of tube 13 terminates at a location above the level of the precursor load which is added through port 18 in container 10, i.e. it does not dip into the organometallic contents. Outlet tube 13 has porous cylindrically shaped element 14 positioned on its inside surface. The entire assembly is made from stainless steel such as, 316L stainless steel. By way of example, porous element 14 is about 1 in. long with a ¼ in. outside diameter. The outside diameter of porous frit element 14 is dimensioned to provide a tight fit with the inside diameter of outlet tube 13. The pore size of element 14 may vary from 1–10 microns.

Figure 3:
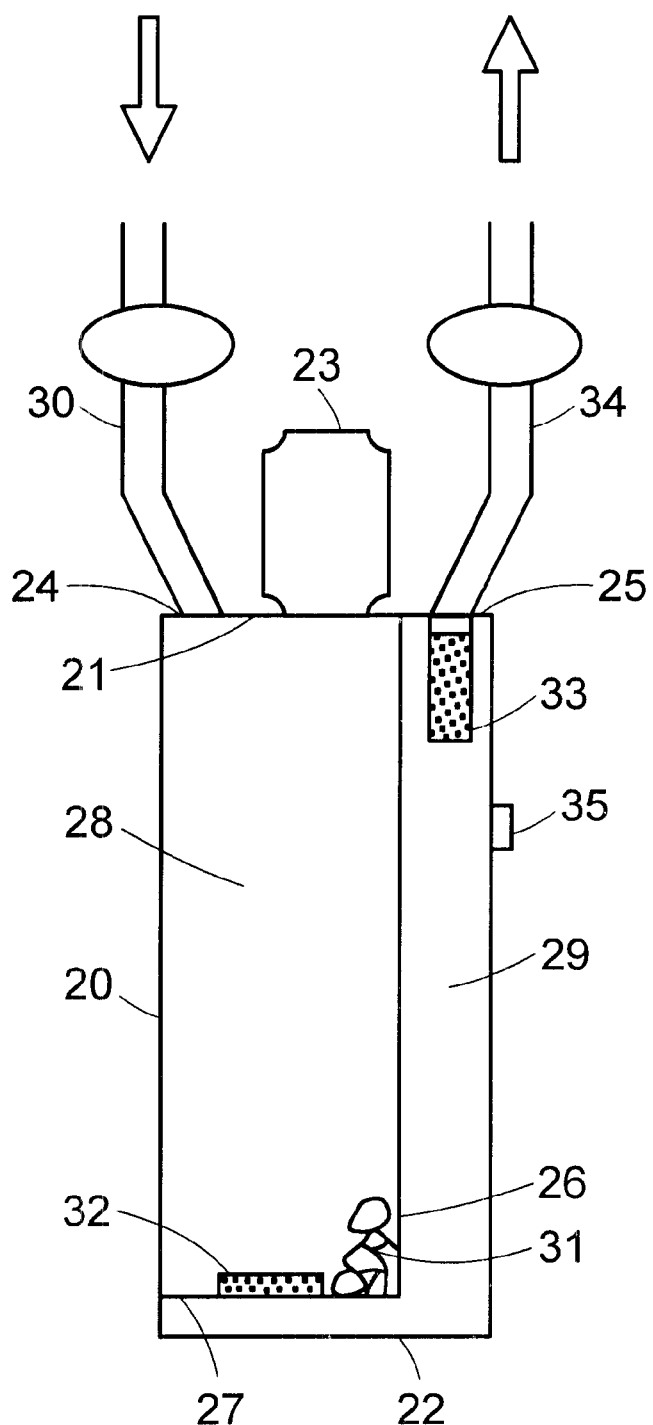
FIG. 3 is a cross sectional view illustrative of the dual fritted bubbler of the present invention.
Figure 4:
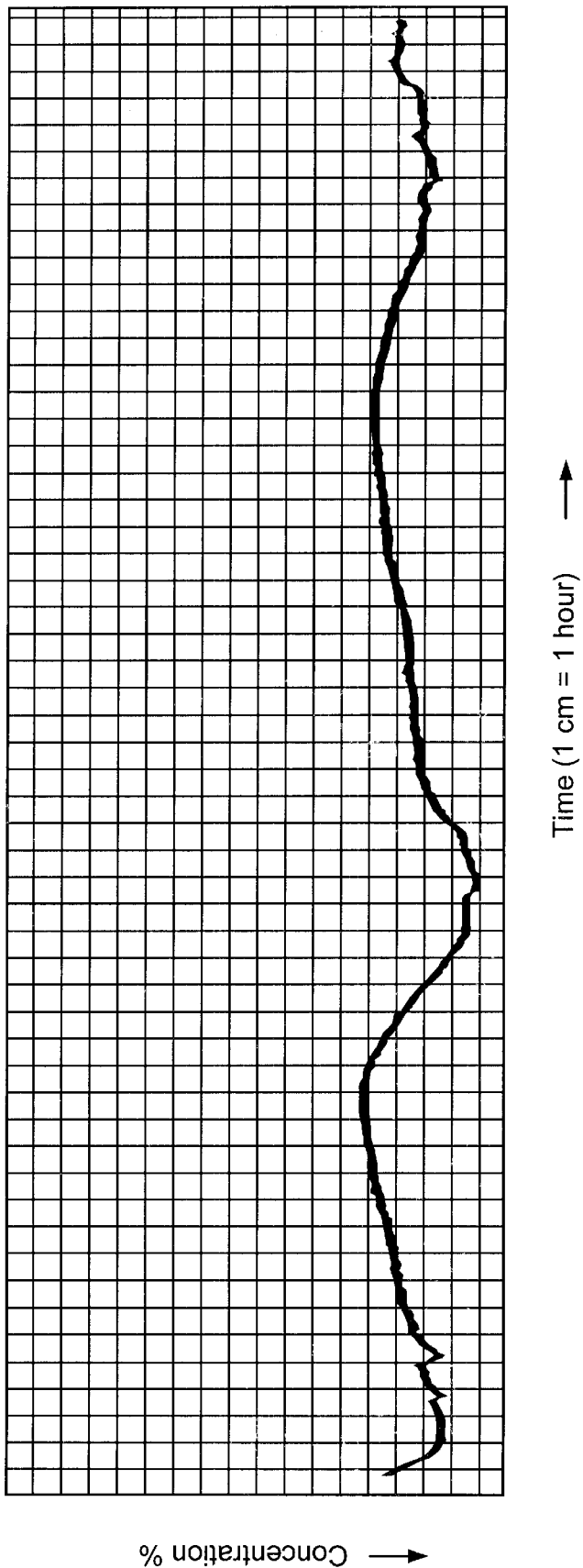
FIG. 4 is an Epison plot showing the % concentration delivery profile of TMI for the FIG. 1 prior art device.

FIG. 3 illustrates the dual frit bubbler design of the present invention. A cylindrically shaped vessel 20 having a top closure portion 21 and a bottom closure portion 22 is used for producing saturated vapors of the solid precursor organometallic compound using a carrier gas.

Top closure portion 21 has fill port 23, inlet 24 and outlet 25 openings. Vessel 20 is partitioned by wall 26 and floor 27 into inlet 28 and outlet 29 chambers. Examples of the carrier gases include nitrogen, argon and helium. The carrier gas enters through inlet tube 30 at the top of vessel 20 and is passed through the organometallic solid 31 contained in inlet chamber 28. The carrier gas becomes saturated with the organometallic compound and exits through porous frit disc 32 in floor 27 into outlet chamber 29. The saturated carrier gas exits vessel 20 by way of outlet tube 34 after passing through porous frit 33 located at the outlet 25 of vessel 20. By way of example, porous frit element 32 is disc shaped having a diameter of 1 in. and a thickness of 0.125 in. and frit element 33 is cylindrically shaped having a length of 1 in. and a diameter of 0.25 in. The organometallic precursor exiting vessel 20 is delivered to a conventional deposition chamber, not shown. Vessel 20 is filled with the precursor metalorganic compound through fill port 23. A port 35 can be provided in the wall of vessel 20 to facilitate cleaning. The port can be opened for washing and closed while filling with organometallic. A conventional mechanism (not shown) can be employed to facilitate the opening and closing of port 35. Vessel 20 may be placed in a thermostatic bath (not shown) and maintained at a suitable temperature for vaporizing the solid organometallic precursor.

The following examples are given in a non limiting manner for illustrating the invention.

In these examples use is made of a porous frit element constituted by a cylinder of about 1 in. length with a ¼ in. outside diameter and a disc having a diameter of 1 in. and a thickness of 0.125 in. made from a sintered 316 L stainless steel having a porosity of 10 microns obtained from Mott Metallurgical Corporation. The porous frit elements can also be made from any compatible metallic or non-metallic material having a pore size varying from about 1 to about 10 microns. Other suitable metals suitable for the porous element include 304 L SS, 321 SS, 347 SS, 430 SS, MONEL, INCONEL, HASTELLOY, and Alloy 20. Non-metals such as glass and teflon can be used for the porous frit so long as they exhibit the required controlled porosity. While particularly shaped porous elements have been specifically described, the specific geometric shapes of the porous frit element are not critical as long as the controlled porosity required for achieving the desired stable flow characteristics is maintained.

EXAMPLE 1

Figure 7:
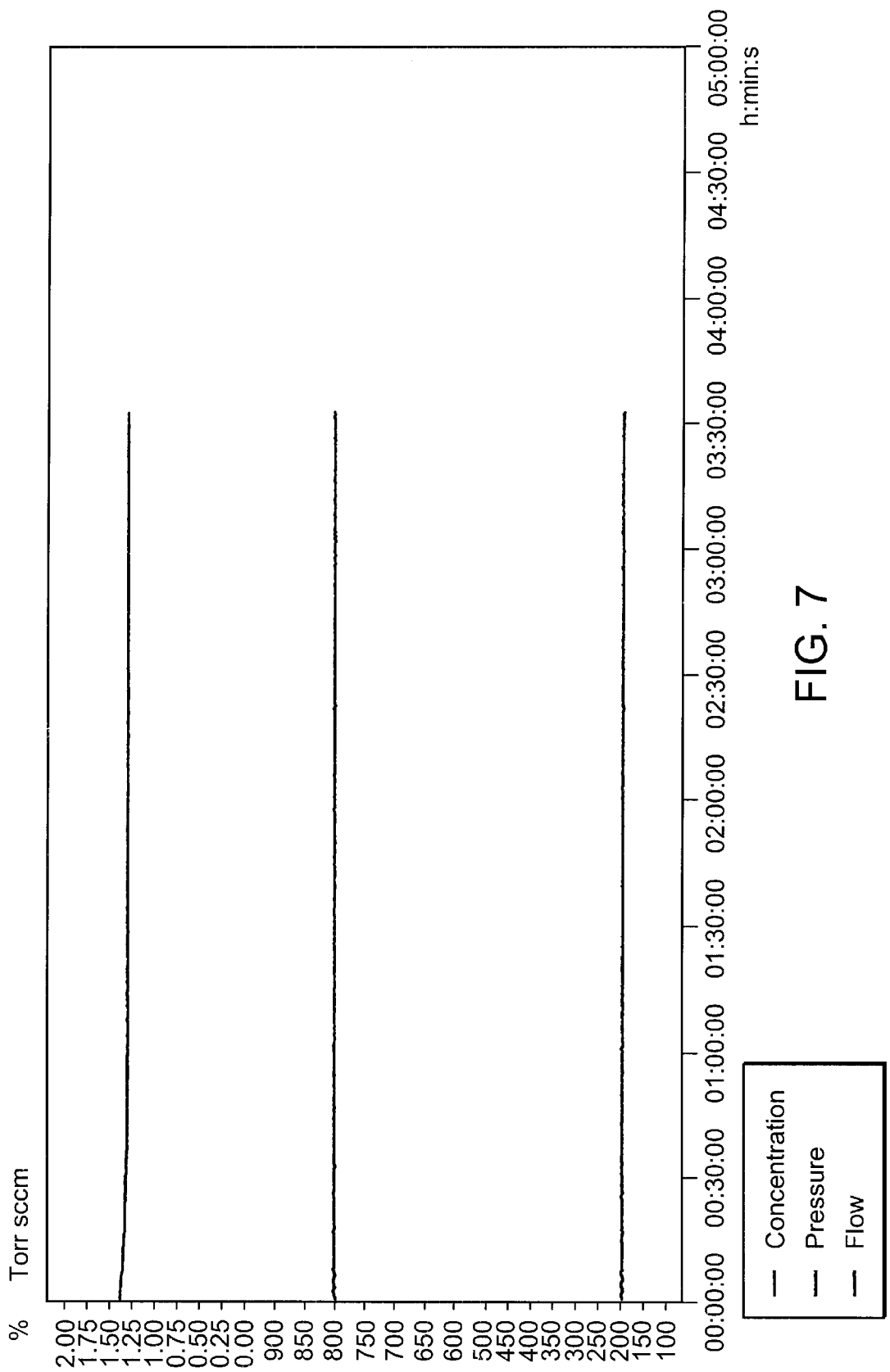
FIG. 7 is an Epison plot showing the % concentration delivery profile of TMI for the FIG. 3 device of the present invention.

40 gms. semiconductor grade trimethyl-indium charge was placed in the dual fritted bubbler of FIG. 3 and a trimethyl-indium charged hydrogen stream was obtained by using a hydrogen carrier. The system pressure was maintained at 800 torr with a 200 sccm hydrogen flow rate. The bubbler maintained a uniform concentration of about 1.3%. The experiment was carried out at 50° C. for about 3.5 hours. The Epison plot for the delivery profile is shown in FIG. 7.

EXAMPLE 2

Figure 8:
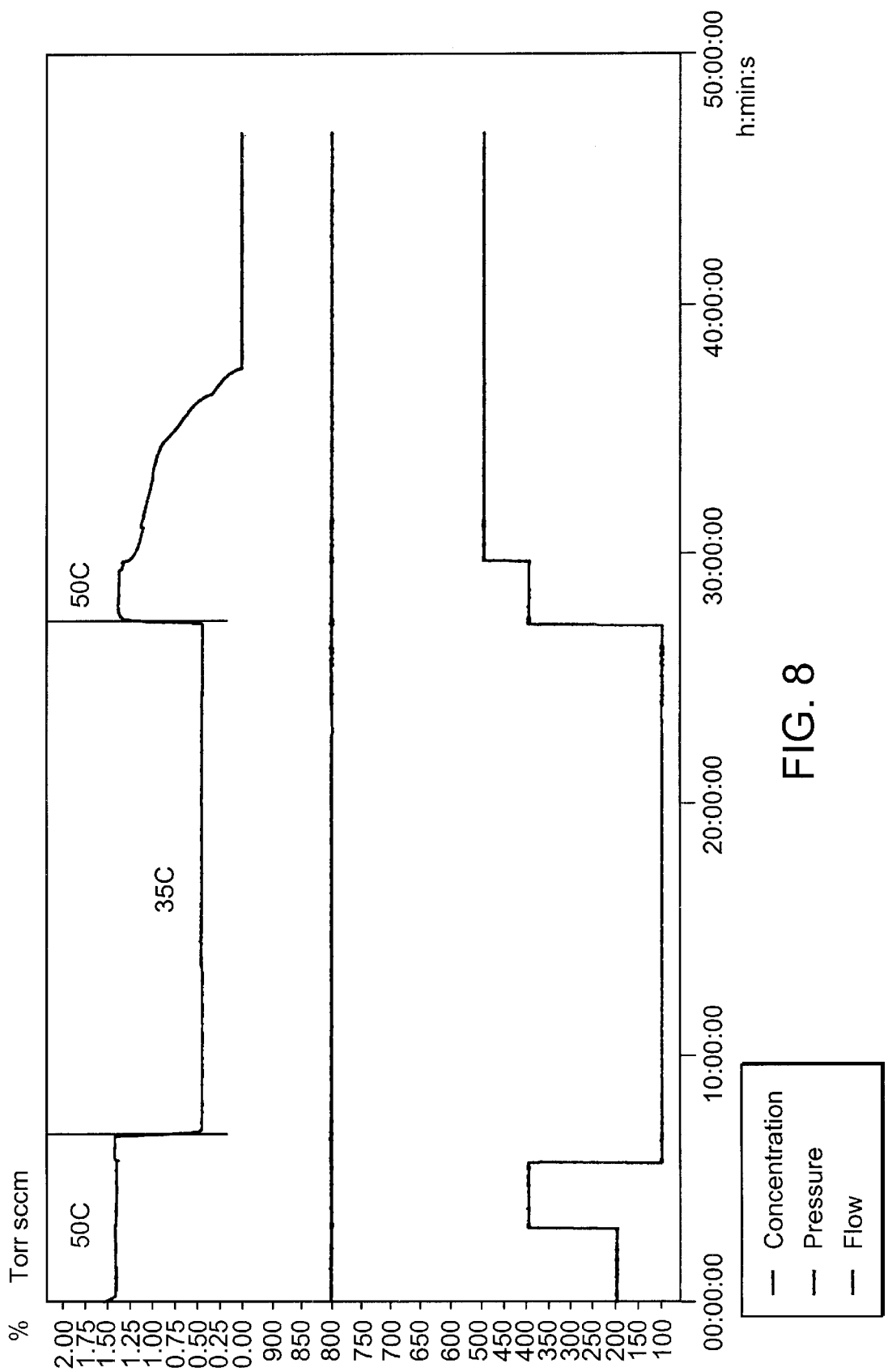
FIG. 8 is an Epison plot showing the % concentration delivery profile as a function of hydrogen flow rate of TMI for the FIG. 3 device of the present invention.

35 gms. charge of semiconductor grade trimethyl-indium was placed in the dual fritted bubbler of FIG. 3 and hydrogen was used as the carrier gas. The Epsilon plot for the delivery profile of TMI is shown in FIG. 8 and was obtained using varying hydrogen gas flow rates between 100 sccm and 500 sccm, a system pressure of 800 torr and a temperature varied between 35° C. and 500° C. The TMI flow was constant at all operating conditions except when the TMI was depleted.

COMPARATIVE EXAMPLE 1

Figure 5:
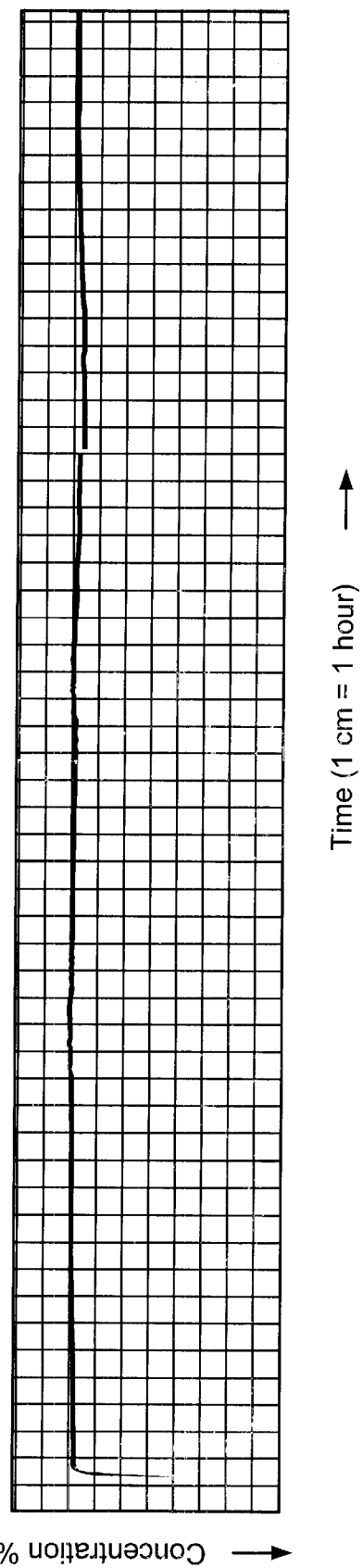
FIG. 5 is an Epison plot showing the % concentration delivery profile of TMI for the FIG. 2 device.

An experiment was run using the bubbler described in copending application Ser. No. 09/378,274 using a 10 g solid semiconductor grade trimethylindium charge was placed in the source bubbler (FIG. 2) and a trimethyl-indium-charged nitrogen stream was obtained by issuing a carrier gas $N_2$ flowed at a rate of 80 sccm and maintaining a temperature of 40° C. Over a 100 hour period the concentration of the TMI flow was observed to be delivered at a steady flow rate with an average concentration of about 0.12%. 5 g of TMI was left in the bubbler. An Epison device is used to plot the delivery profile of TMI as shown in FIG. 5. An Epison device measures the concentration of a chemical vapor in another inert gas, usually $H_2$, $N_2$ or argon.

COMPARATIVE EXAMPLE 2

Figure 6:
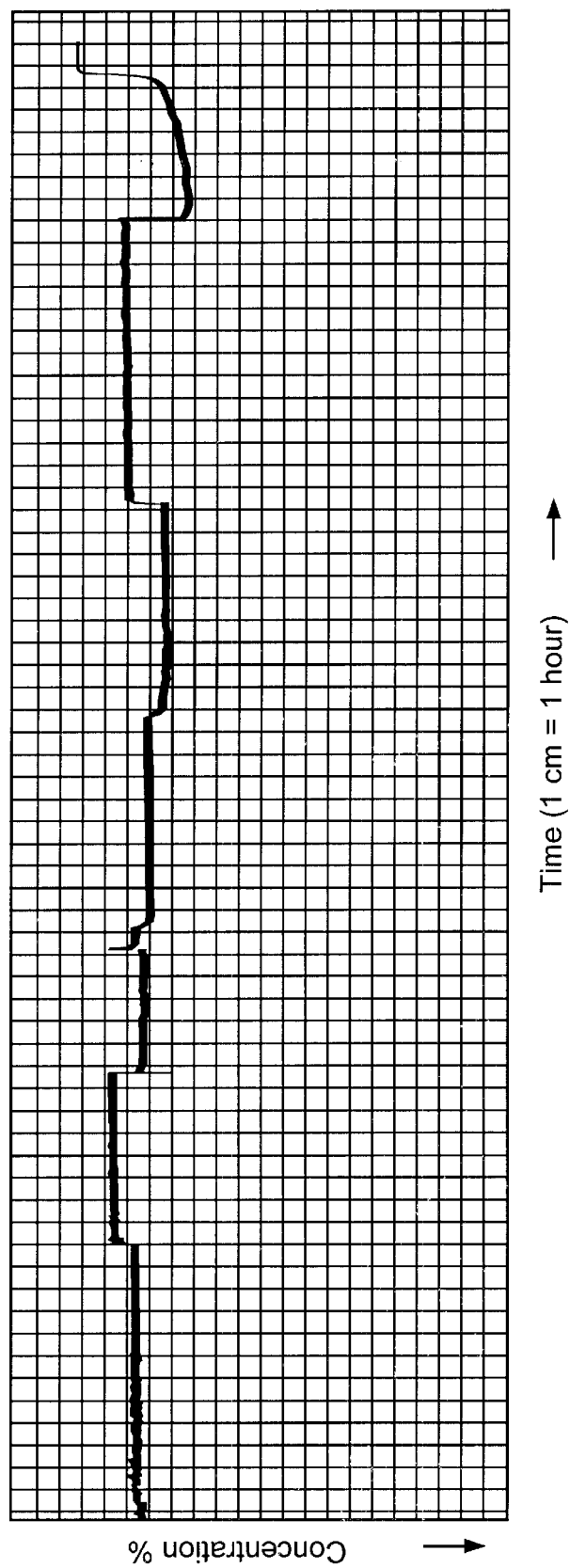
FIG. 6 is an Epison plot showing the % concentration delivery profile of TMI as a function of temperature and flow rates for the FIG. 2 device.

A second experiment was run with the bubbler described in copending application Ser. No. 09/378,274 using a 5 g semiconductor grade trimethyl-indium charge was placed in a source bubbler (FIG. 2) and a trimethyl-indium charged nitrogen stream was obtained by using varying nitrogen gas flow rates between 80 and 400 sccm and temperatures between 40 and 55° C., according to the following sequence: 80 sccm at 40° C., 200 sccm at 40° C., 40 sccm at 40° C., 80 sccm at 40° C., 80 sccm at 50° C., 80 sccm at 55° C., 200 sccm at 55° C. and 400 sccm at 55° C. Over a 72 hour period the concentration of the TMI was steady at each set of operating parameters. The TMI was completely depleted from the bubbler at the end of the experiment. The Epison plot for the delivery profile of TMI at the different set of conditions is shown in FIG. 6.

The above Examples demonstrate that the dual fritted bubbler design of the invention provides significant advantages over the prior art delivery systems of the comparative Examples in that the inventive dual fritted bubbler supplies the reagent at a uniform flow rate whereas the device in the comparative examples provides erratic delivery. The advantage of the dual fritted bubbler over the fritted bubbler of copending application Ser. No. 09/378,274 is that under similar operating conditions the dual frifted bubbler of the present invention delivers a much higher concentration of the solid precursor vapors. This is important in the operation of MOVPE devices when high growth rates or deposition over large areas is desired. In the dual fritted bubbler, the the carrier gas passes through the bed of solid organometallic precursors and becomes saturated before exiting through the porous frit located in the floor of the inlet chamber. This results in a level of saturation that cannot be acheived by simply passing the carrier gas over the solid precursor. This specific feature of the dual fritted bubbler results in a higher concentration output than is possible with prior bubbler designs including the the single fritted bubbler of copending application Ser. No. 09/378,274.

It is clear that what has been described earlier has been given solely by way of non-limiting example. Variations and modifications are possible without exceeding the scope of the claims. For example, the vapor generator may have a geometric shape other than cylindrical.

What is claimed is:

1. A device for feeding a fluid stream saturated with organometalic compound material to a chemical vapor deposition system comprising, a vessel comprising an elongated cylindrical shaped portion having an inner surface defining a substantially constant cross section throughout the length of said cylindrical portion, a top closure portion and a bottom closure portion, said top closure portion having an inlet opening for the introduction of carrier gas and an outlet opening, said elongated cylindrical shaped portion having inlet and outlet chambers in fluid communication wherein the floor of said inlet chamber is spaced from said bottom closure portion, the floor of said inlet chamber comprising a first porous element which allows vapors generated in said inlet chamber to pass into said outlet chamber, wherein said inlet opening is in fluid communication with said inlet chamber and said outlet opening is in fluid communication with said outlet chamber, wherein said inlet opening is in fluid communication with said inlet chamber and said outlet opening is in fluid communication with said outlet chamber, a source of solid organometallic precursor compound contained within said inlet chamber of said vessel, said device further comprising a second porous element located at said outlet opening, whereby said fluid stream exits said vessel by passing through said porous element.

2. A device as specified in claim 1 wherein said outlet comprises a tube which extends from one end within said vessel.

3. A device as specified in claim 2 wherein said second porous element is attached inside the outlet tube.

4. A device as specified in claim 1 wherein said top closure portion further includes a fill port for loading reactive material into said inlet chamber.

5. A device as specified in claim 3 wherein said first and second porous elements comprise porous frit material.

6. A device of claim 5 wherein the porous frit material is comprised of sintered metal.

7. A device of claim 6 wherein the sintered metal comprises stainless steel.

8. A device according to claim 5 wherein the porous frit material comprises glass or teflon.

9. A method for delivering a uniform supply of feed gas substantially saturated with a consistently high concentration of organometallic compound as a function of time which comprises:

loading solid organometallic compound material into the inlet chamber and supplying heat to the vessel of claim 1, introducing a carrier gas into said inlet chamber of said vessel through the carrier gas inlet opening, said vessel being maintained at a constant temperature sufficient to vaporize said organometallic compound, and flowing said carrier gas at a sufficient flow rate in contact with said organometallic compound to substantially saturate said carrier with said compound, said compound saturated carrier gas exiting from said inlet chamber through a first porous element in the floor of the inlet chamber into the outlet chamber of said vessel, where said compound saturated carrier gas flows from said outlet chamber through a second porous element at the outlet of said vessel, thereby producing a substantially uniform flow rate of said organometallic compound saturated carrier gas with a substantially consistently high concentration of organometallic compound.

10. A method according to claim 9 wherein the gas substantially saturated with the organometallic compound flowing from said vessel is suitable for use as a feed gas for film formation.

11. A dual chambered bubbler containing solid precursors for use in a vapor deposition process comprising:

a closed cylindrical vessel having top and bottom portion with inlet and an outlet ports located in the said top portion of said vessel through which carrier gas enters and exits the bubbler, said vessel comprising an inlet chamber terminating in a floor spaced from the vessel bottom for housing the solid precursors, a first porous element located in said floor of said inlet chamber, an outlet chamber in fluid communication with said inlet chamber, and a second porous element located at the outlet port of said outlet chamber.

* * * * *